United States Patent
Chen et al.

(10) Patent No.: US 8,144,880 B2
(45) Date of Patent: Mar. 27, 2012

(54) AUDIO AMPLIFIER CAPABLE OF PERFORMING SELF-OSCILLATION

(75) Inventors: Ming-Hsiung Chen, Taipei (TW); Shang-Shu Chung, Taipei (TW); Ming-Chung Li, Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 1241 days.

(21) Appl. No.: 11/563,692

(22) Filed: Nov. 28, 2006

(65) Prior Publication Data
US 2008/0080726 A1    Apr. 3, 2008

(30) Foreign Application Priority Data
Oct. 3, 2006  (TW) .............................. 95217648 U

(51) Int. Cl.
*H04R 5/00*    (2006.01)
(52) U.S. Cl. ........... 381/28; 381/104; 381/106; 330/251
(58) Field of Classification Search .................... 381/28, 381/57, 104, 106, 120, 123; 330/251, 297, 330/86
See application file for complete search history.

(56) References Cited

U.S. PATENT DOCUMENTS

| | | | |
|---|---|---|---|
| 2005/0179487 A1* | 8/2005 | Lee et al. | 330/10 |
| 2005/0270093 A1* | 12/2005 | Kurokawa | 330/10 |
| 2007/0170902 A1* | 7/2007 | Chen et al. | 323/282 |

FOREIGN PATENT DOCUMENTS

JP        07231226 A    *   8/1995

* cited by examiner

*Primary Examiner* — Vivian Chin
*Assistant Examiner* — Leshui Zhang
(74) *Attorney, Agent, or Firm* — Winston Hsu; Scott Margo

(57) ABSTRACT

An audio amplifier includes a plurality of sub-audio amplifier sets, a clock source, and a speaker. When the audio amplifier is under an audio amplify mode, the plurality of sub-audio amplifier sets is operated under a synchronic operating frequency with a same clock signal generated by the clock source. When the audio amplifier is under a self-oscillation mode, the clock signal is isolated from being input to the plurality of sub-audio amplifier sets. A higher distortion is prevented by repeatedly charging and discharging an oscillating capacitor of a sub-audio amplifier in a sub-audio amplifier set.

3 Claims, 2 Drawing Sheets

AUDIO AMPLIFIER CAPABLE OF PERFORMING SELF-OSCILLATION

BACKGROUND OF THE INVENTION

1. Field of the Invention

The present invention relates to an audio amplifier, and more particularly, to an audio amplifier capable of performing self-oscillation.

2. Description of the Prior Art

Current conventional audio amplifiers are primarily implemented with Class D amplifiers. A conventional Class AB amplifier generates linear signals whereas a Class D amplifier generates pulse width modulation (PWM) signals, which primarily consist of audio signals, PWM activate signals, and harmonic waves. When a Class D amplifier operates, an output stage metal oxide semiconductor filed-effect transistor is switched from having a high resistance to a low resistance. Moreover, the Class D amplifier takes a significantly small duration in each cycle to operate under an active region, and therefore, the output stage power consumption of the Class D amplifier is far lower than the output stage power consumption of the Class AB amplifier. Besides, a LC filter, which has inductors and capacitors, stores enough power during an active region of each cycle of the Class D amplifier so that the stored power is not exhausted in each cycle by the power consumption of a speaker driven by said Class D amplifier.

However, while a plurality of Class D amplifiers is utilized in the same circuit at the same time, unnecessary noise is generated if output audio signals of said plurality of Class D amplifiers are asynchronous with each other so that a related audio output quality is significantly decreased. Moreover, under the circumstance that an operating frequency of a Class D amplifier is not properly manipulated, the Class D amplifier is easily disturbed by other noise having a similar frequency with said operating frequency of the Class D amplifier. When it is required to output audio signals from a Class D amplifier continuously, inputting audio signals into said Class D amplifier easily leads to a distortion of a previously inputted audio signal of said Class D amplifier, and leads to an entire decrease of output audio quality of said Class D amplifier.

SUMMARY OF THE INVENTION

The claimed invention provides an audio amplifier capable of performing self-oscillation. The audio amplifier comprises a plurality of sub-audio amplifier sets, a clock source, and a speaker. Each of the plurality of sub-audio amplifier sets comprises a sub-audio amplifier, an audio source, a clock switch, a pre-driver, a transistor set, an inductor, and a second capacitor. The sub-audio amplifier comprises a first comparator, a first resistor, a second resistor, a third resistor, a second comparator, and a first capacitor. The first comparator has a positive input terminal coupled to a reference voltage source. The first resistor has a first terminal coupled to a negative input terminal of the first comparator, and has a second terminal coupled to an audio input terminal of the sub-audio amplifier. The second resistor has a first terminal coupled to the negative input terminal of the first comparator. The third resistor has a first terminal coupled to the negative input terminal of the first comparator, and has a second terminal coupled to a feedback input terminal of the sub-audio amplifier. The second comparator has a negative input terminal coupled to the reference voltage source, a positive input terminal coupled to an output terminal of the first comparator, and an output terminal coupled to the audio output terminal of the sub-audio amplifier. The first capacitor has a first terminal coupled to the negative input terminal of the first comparator, and a second terminal coupled to the positive input terminal of the second comparator. The audio source is coupled to the audio input terminal of the sub-audio amplifier. The clock switch is coupled to a clock input terminal of the sub-audio amplifier. The pre-driver is coupled to the audio output terminal of the sub-audio amplifier. The transistor set has a first input terminal coupled to a first output terminal of the pre-driver, and a second input terminal coupled to a second output terminal of the pre-driver. The inductor has a first terminal coupled to an output terminal of the transistor set. The second capacitor has a first terminal coupled to a second terminal of the inductor, and a second terminal coupled to ground. The clock source is coupled to a plurality of clock switches of the plurality of sub-audio amplifier sets. The speaker is coupled to a second terminal of the inductor in each sub-audio amplifier set of the plurality of sub-audio amplifier sets.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
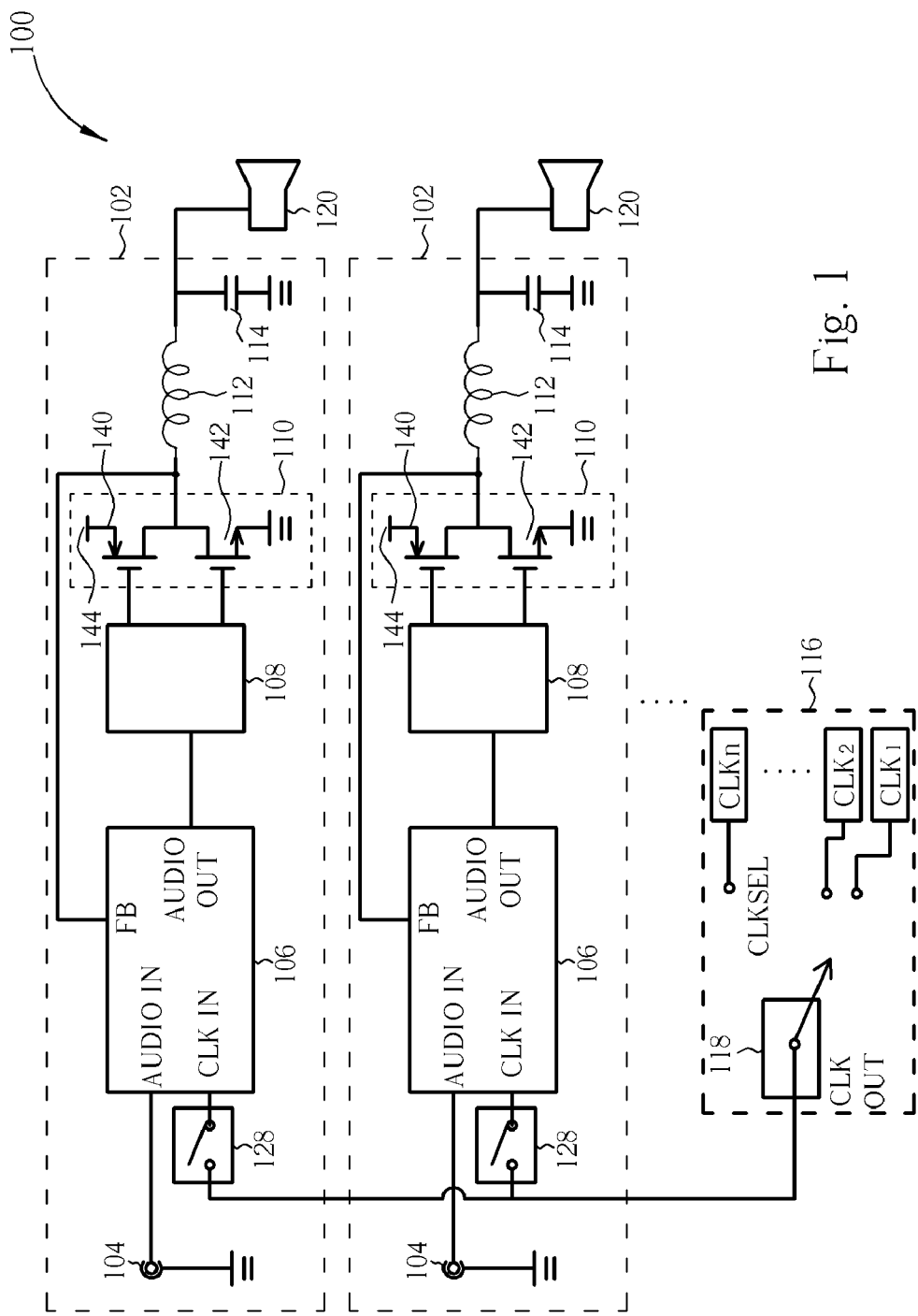
FIG. 1 is a diagram of an audio amplifier according to a preferred embodiment of the present invention.

Please refer to FIG. 1, which is a diagram of an audio amplifier 100 according to a preferred embodiment of the present invention. As shown in FIG. 1, the amplifier 100 includes a plurality of sub-audio amplifier sets 102, a clock source 116, and a speaker 120. Each sub-audio amplifier set 102 includes a sub-amplifier 106, an audio source 104, a pre-driver 108, a transistor set 110, a filter inductor 112, a filter capacitor 114, and a clock switch 128. The audio source 104 is coupled to an audio input terminal of the sub-audio amplifier 106, as denoted with AUDIO IN shown in FIG. 1. The pre-driver 108 has an input terminal coupled to an audio output terminal of the sub-audio amplifier 106, as denoted with AUDIO OUT shown in FIG. 1. The transistor set 110 has a first input terminal coupled to a first output terminal of the pre-driver 108, and a second input terminal coupled to a second output terminal of the pre-driver 108. The filter inductor 112 has a first terminal coupled to an output terminal of the transistor set 110. The filter capacitor 114 has a first terminal coupled to a second terminal of the filter inductor 112, and a second terminal coupled to ground. A filter is formed with both the filter inductor 112 and the filter capacitor 114 for filtering out frequencies outside of a specific frequency domain of an output signal. The clock switch 128 is coupled to a clock input terminal of the sub-audio amplifier 106, as denoted with CLK IN shown in FIG. 1. Please refer to FIG. 2, which is a diagram of both the sub-audio amplifier 106 and the clock switch 128 of the sub-audio amplifier set 102 shown in FIG. 1, with referred to FIG. 1 also. The sub-audio amplifier 106 includes a first comparator 122, a first resistor 124, a second resistor 126, a third resistor 130, a second comparator 132, and an oscillating capacitor 134. The first comparator 122 has a positive input terminal coupled to a reference voltage source VREF. The first resistor 124 has a first terminal coupled to a negative input terminal of the first comparator 122, and a second terminal coupled to the audio input terminal of the sub-audio amplifier 106, as denoted with AUDIO IN shown in both FIG. 1 and FIG. 2. The second resistor 126 has a first terminal coupled to the negative input terminal of the first comparator 122. The third resistor 130 has a first terminal coupled to the first terminal of the second resistor 126 and the negative input terminal of the first comparator 122, and a second terminal coupled to a feedback input terminal of the sub-audio amplifier 106, as denoted with FB shown in both FIG. 1 and FIG. 2. The second comparator 132 has a negative input terminal coupled to the reference voltage source VREF, and a positive input terminal coupled to an output terminal of the first comparator 122, and an output terminal coupled to an audio output terminal of the sub-audio amplifier 106, as denoted with AUDIO OUT shown in both FIG. 1 and FIG. 2. The oscillating capacitor 134 has a first terminal coupled to the negative input terminal of the first comparator 122, and a second terminal coupled to the positive input terminal of the second comparator 132. Please refer to FIG. 1, the clock source 116 is coupled to the clock switch 128 of each sub-audio amplifier set 102. The speaker 120 is coupled to a second terminal of the filter inductor 112 of each sub-audio amplifier set 102. The transistor set 110 includes a first transistor 140 and a second transistor 142. The first transistor 140 has a gate coupled to the first input terminal of the transistor set 110, a source coupled to a voltage source 144, and a drain coupled to the output terminal of the transistor set 110. The second transistor 142 has a gate coupled to the second input terminal of the transistor set 110, a source coupled to ground, and a drain coupled to the output terminal of the transistor set 110. The transistor set 110 is utilized for serving as an output amplifying stage for amplifying signals outputted from the pre-driver 108. The clock source 116 includes a plurality of sub-clock sources $CLK_1, CLK_2, \ldots, CLK_n$, and a clock multiplexer 118. The clock multiplexer 118 is coupled to one of the plurality of sub-clock sources $CLK_1, CLK_2, \ldots, CLK_n$, for selecting the coupled one from the plurality of sub-clock sources $CLK_1, CLK_2, \ldots, CLK_n$, and for outputting a clock generated by the selected sub-clock source into the sub-audio amplifier 106.

Figure 2:
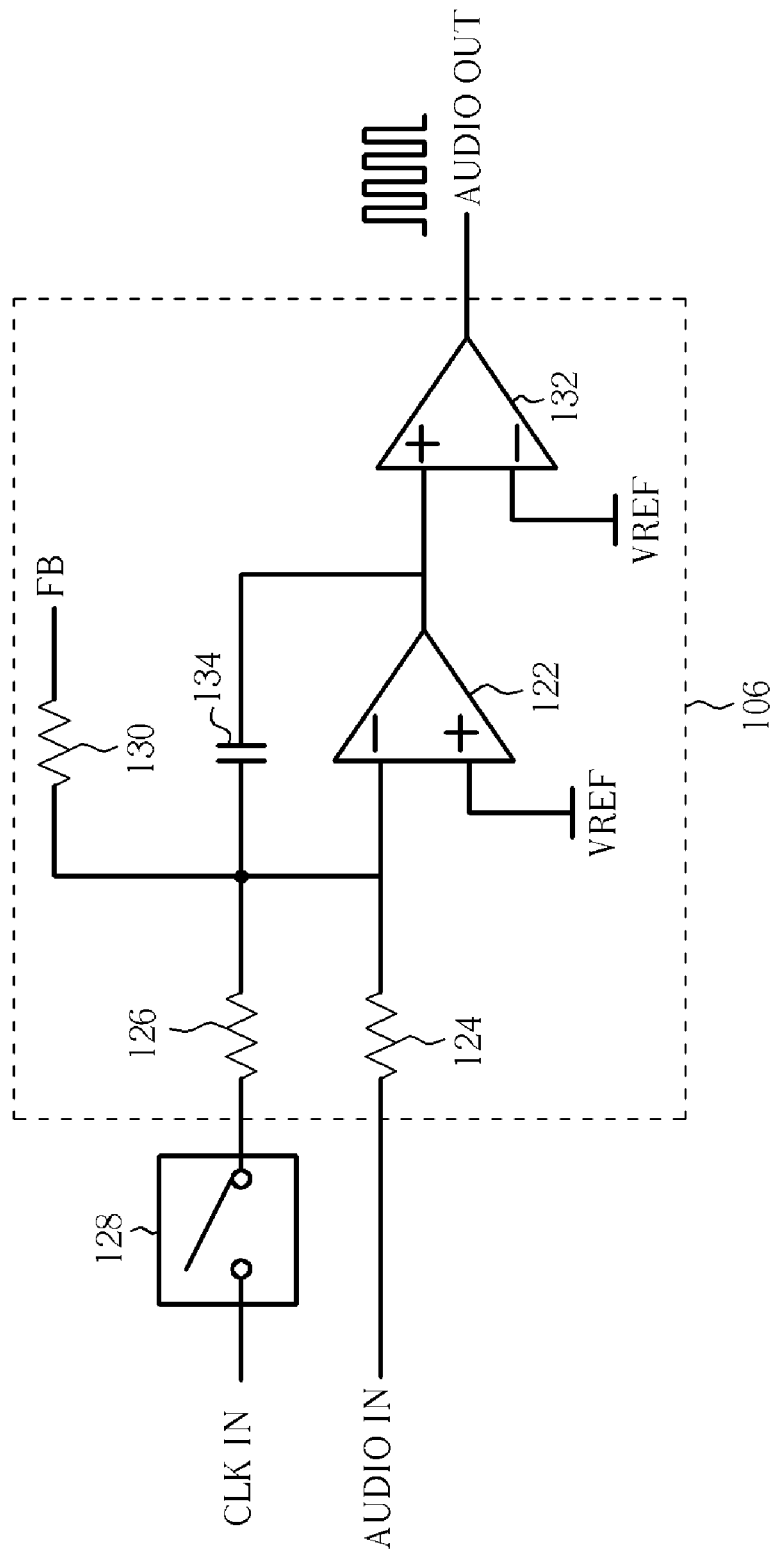
FIG. 2 is a diagram of both the sub-audio amplifier and the clock switch of the sub-audio amplifier set shown in FIG. 1.

The transistor set 110 shown in FIG. 1 merely belongs to a preferred embodiment of the present invention, and therefore, other transistor sets (even single transistors) for replacing the transistor 110 shown in FIG. 1 also fall within the scope of the present invention. The pre-driver 108 shown in FIG. 1 is also a conventional pre-driver, therefore, replacing the pre-driver 108 shown in FIG. 1 with other elements having the same functions as the pre-driver 108 should not be limitations to the present invention either. The sub-audio amplifier 106 shown in FIG. 1 is a Class D amplifier, and moreover, the detailed embodiment of the sub-audio amplifier 106 shown in FIG. 2 is merely a preferred embodiment of the present invention. It indicates the fact that replacing the sub-audio amplifier 106 shown in FIG. 1 or FIG. 2 with other elements having the same function as the sub-audio amplifier 106 should not be limitations to the present invention.

The audio amplifier 100 of the present invention has two operation modes, one of which is an audio amplify mode for transforming inputted audio signals into pulse width modulation signals, and the other one of which is a self-oscillation mode for performing self-oscillation when no audio signal is inputted, and for achieving a lower distortion. Note that each sub-audio amplifier set 102 of the audio amplifier 100 also has the audio amplify mode and the self-oscillation mode.

When the audio amplifier 100 of the present invention is under the audio amplify mode, besides audio signals being inputted into each sub-audio amplifier set 102 through each audio source 104, a clock signal is also inputted into each sub-audio amplifier set 102 through the clock source 116, for manipulating an operating frequency of each sub-audio amplifier set 102. A first sub-audio amplifier set 102 is under the audio amplify mode when the clock switch 128 of said first sub-audio amplifier set 102 is short-circuited, whereas a second sub-audio amplifier set 102 is shut down when the clock switch 128 of said second sub-audio amplifier set 102 is open-circuited. Therefore, a selected plurality of sub-audio amplifier sets 102 is determined to be under the audio amplify mode when corresponding clock switches 128 are short-circuited. Note that all of the plurality of sub-audio amplifier sets 102 may be selected to be under the audio amplify mode also. Then a clock signal is inputted from the clock source 116 so that a corresponding plurality of clock switches 128 of a selected plurality of sub-audio amplifier sets 102 is short-circuited, and at this time, said selected plurality of sub-audio amplifier sets 102 has a synchronous frequency with each other. Therefore, when pulse width modulation signals are outputted from each selected sub-audio amplifier set 102 to each of the plurality of speakers 120 for emitting sounds, the outputted pulse width modulation signals are synchronous with each other. The aim of the present invention for preventing noise and acquiring a better audio quality is thus achieved. In a preferred embodiment of the present invention, audio signals from the audio source 104 are square waves for facilitating manipulating a synchronous operating frequency of each of the plurality of sub-audio amplifier sets 102.

A clock signal outputted from the clock source 116 is determined according to which sub-clock source the clock multiplexer 118 is coupled to, and therefore, the plurality of sub-audio amplifier sets 102 may have an optimal synchronous operating frequency dominated by said coupled sub-clock source for meeting various circumstances. For example, when the synchronous operating frequency of the plurality of sub-audio amplifier sets 102 gets close to a frequency domain of certain mass broadcast radio channels, said plurality of sub-audio amplifier sets 102 gets easier to be disturbed. However, through switching of the clock multiplexer 118 applied in the present invention, an optimal sub-clock source under such a circumstance is selected for preventing disturbances.

When the audio amplifier 100 of the present invention is under the self-oscillation mode, a plurality of clock switches 128 of a selected plurality of sub-audio amplifier sets 102 is open-circuited for isolating the clock signal outputted from the clock source 116 from said selected plurality of sub-audio amplifier sets 102. Moreover, an audio signal, which is inputted into one of the selected plurality of sub-audio amplifier sets 102 before a corresponding clock switch 128 is open-circuited, is utilized for generating a feedback audio signal, which is then inputted back into the corresponding sub-audio amplifier 106 for recursively charging and discharging the oscillating capacitor 134, and it indicates self-oscillation of the feedback audio signal in the sub-audio amplifier set 102. When a sub-audio amplifier set 102 is under the self-oscillation mode, an oscillate frequency of said sub-audio amplifier 102 is determined by both the third resistor 130 and the oscillating capacitor 134. As a result, recursive self-oscillation inside a sub-audio amplifier set 102 maintains both a magnitude and a frequency of an audio signal outputted from said sub-audio amplifier set 102 within a certain degree, for achieving the aim of a low distortion in the present invention.

Under the audio amplify mode of the audio amplifier of the present invention, a plurality of sub-audio amplifier sets is synchronized with the same clock signal for relieving noise resulting from asynchronous operating frequencies of a plurality of Class D amplifiers. By selecting various sub-clock sources according to various circumstances, the audio amplifier of the present invention may be relieved from having a synchronous operating frequency close to other disturbing frequencies of noise. Under the self-oscillation mode of the audio amplifier of the present invention, audio signals previously inputted into each sub-audio amplifier set are utilized for generating feedback signals to recursively charge and discharge corresponding oscillating capacitors. Therefore, both a magnitude and a frequency of an outputted audio signal are maintained within a certain domain for achieving the aim of low distortion in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio amplifier capable of performing self-oscillation comprising:
   a plurality of sub-audio amplifier sets, where each of the plurality of sub-audio amplifier sets comprises:
      a sub-audio amplifier comprising:
         a first comparator having a positive input terminal coupled to a reference voltage source;
         a first resistor having a first terminal coupled to a negative input terminal of the first comparator, and having a second terminal coupled to an audio input terminal of the sub-audio amplifier;
         a second resistor having a first terminal coupled to a negative input terminal of the first comparator;
         a third resistor having a first terminal coupled to the negative input terminal of the first comparator, and having a second terminal coupled to a feedback input terminal of the sub-audio amplifier;
         a second comparator having a negative input terminal coupled to the reference voltage source, a positive input terminal coupled to an output terminal of the first comparator, and an output terminal coupled to the audio output terminal of the sub-audio amplifier; and
         a first capacitor having a first terminal coupled to the negative input terminal of the first comparator, and a second terminal coupled to the positive input terminal of the second comparator;
      an audio source coupled to the audio input terminal of the sub-audio amplifier;
      a clock switch coupled to a clock input terminal of the sub-audio amplifier;
      a pre-driver coupled to an audio output terminal of the sub-audio amplifier;
      a transistor set having a first input terminal coupled to a first output terminal of the pre-driver, and a second input terminal coupled to a second output terminal of the pre-driver;
      an inductor having a first terminal coupled to an output terminal of the transistor set; and
      a second capacitor having a first terminal coupled to a second terminal of the inductor, and a second terminal coupled to ground;
   a clock source coupled to a plurality of clock switches of the plurality of sub-audio amplifier sets; and
   a speaker coupled to the second terminal of the inductor in each sub-audio amplifier set of the plurality of sub-audio amplifier sets;
   wherein the sub-audio amplifier is electrically connected to the clock source when the clock switch is short-circuited, and the sub-audio amplifier is electrically disconnected from the clock source when the clock switch is open-circuited.

2. The audio amplifier of claim 1 wherein the transistor set comprises:
   a first transistor having a gate coupled to the first input terminal of the transistor set, a source coupled to a voltage source, and a drain coupled to the output terminal of the transistor set; and
   a second transistor having a gate coupled to the second input terminal of the transistor set, a source coupled to ground, and a drain coupled to the output terminal of the transistor set.

3. The audio amplifier of claim 1 wherein the clock source comprises:
   a plurality of sub-clock sources; and
   a clock multiplexer coupled to one of the plurality of sub-clock sources, for determining which one of the plurality of sub-clock sources is to be applied for providing a clock generated by the determined one of the plurality of sub-clock sources.

* * * * *